United States Patent
Yang

(10) Patent No.: US 8,274,819 B2
(45) Date of Patent: Sep. 25, 2012

(54) READ DISTURB FREE SMT MRAM REFERENCE CELL CIRCUIT

(75) Inventor: Hsu Kai Yang, Pleasanton, CA (US)

(73) Assignee: MagIC Technologies, Milpitas, CA (US)

( * ) Notice: Subject to any disclaimer, the term of this patent is extended or adjusted under 35 U.S.C. 154(b) by 301 days.

(21) Appl. No.: 12/658,228

(22) Filed: Feb. 4, 2010

(65) Prior Publication Data

US 2011/0188305 A1 Aug. 4, 2011

(51) Int. Cl.
*G11C 11/00* (2006.01)
(52) U.S. Cl. .................. 365/158; 365/189.09; 365/205; 365/210.1; 365/210.11
(58) Field of Classification Search .................. 365/158, 365/189.09, 205, 210.1, 210.11
See application file for complete search history.

(56) References Cited

U.S. PATENT DOCUMENTS

| | | | |
|---|---|---|---|
| 7,272,034 B1 | 9/2007 | Chen et al. | |
| 7,576,956 B2 | 8/2009 | Huai | |
| 2005/0083747 A1* | 4/2005 | Tang et al. | 365/210 |
| 2005/0180205 A1* | 8/2005 | Park et al. | 365/171 |
| 2007/0223150 A1 | 9/2007 | Fukuzawa et al. | |
| 2008/0219044 A1 | 9/2008 | Yoon et al. | |
| 2009/0067212 A1 | 3/2009 | Shimizu | |
| 2009/0135651 A1 | 5/2009 | Kojima et al. | |
| 2009/0251951 A1 | 10/2009 | Yoshikawa et al. | |

OTHER PUBLICATIONS

Co-Pending U.S. Appl. No. 12/454,925, filed May 26, 2009, "Read Disturb-Free SMT Reference Cell Scheme," assigned to the same assignee as the present invention.
"A Perpendicular Spin Torque Switching Based MRAM for the 28 nm Technology Node," U.K. Klostermann et al., 2007 IEEE, 1-4244-0439-X/07, pp. 187-190.
"A Novel Nonvolatile Memory with Spin Torque Transfer Magnetization Switching: Spin-RAM," by M. Hosomi et al., IEEE International Electron Devices Meeting, 2005, IEDM Technical Digest, Dec. 2005, pp. 459-462.
International Search Report—PCT/US 11/00197 Mail date—Apr. 4, 2011, Magic Technologies, Inc.

* cited by examiner

*Primary Examiner* — Hoai V Ho
(74) *Attorney, Agent, or Firm* — Saile Ackerman LLC; Stephen B. Ackerman; Billy Knowles

(57) ABSTRACT

An array of SMT MRAM cells has a read reference circuit that provides a reference current that is the sum of a minimum current through a reference SMT MRAM cell programmed with a maximum resistance and a maximum current through an reference SMT MRAM cell programmed with a minimum resistance. The reference current forms an average reference voltage at the reference input of a sense amplifier for reading a data state from selected SMT MRAM cells of the array such that the reference SMT MRAM cells will not be disturbed during a read operation. The read reference circuit compensates for current mismatching in the reference current caused by a second order non matching effect.

12 Claims, 5 Drawing Sheets

FIG. 1 – Prior Art

READ DISTURB FREE SMT MRAM REFERENCE CELL CIRCUIT

RELATED PATENT APPLICATIONS

"A Read Disturb Free SMT MRAM Reference Cell Scheme", U.S. Ser. No. 12/454,925, Filing Date May 26, 2009, assigned to the same assignee as the present invention, and incorporated herein by reference in its entirety.

BACKGROUND OF THE INVENTION

1. Field of the Invention

This invention relates generally to magnetic random access memory (MRAM) cells and array structures for spin moment transfer (SMT) MRAM cells. More particularly, this invention relates to SMT MRAM read reference circuits for determining a data state of selected SMT MRAM during a read operation.

2. Description of Related Art

The term spin moment transfer MRAM refers to a magnetic tunnel junction (MTJ) random access memory (RAM). In this context, the term "spin" refers to the angular momentum of electrons passing through an MTJ that will alter the magnetic moment of a free layer of an MTJ device. Electrons possess both electric charge and angular momentum (or spin). It is known in the art that a current of spin-polarized electrons can change the magnetic orientation of a free ferromagnetic layer of an MTJ via an exchange of spin angular momentum.

"A Novel Nonvolatile Memory with Spin-torque Transfer Magnetization Switching: Spin-Ram", Hosomi, et al., IEEE International Electron Devices Meeting, 2005. IEDM Technical Digest. December 2005, pp.: 459-462, provides a nonvolatile memory utilizing spin-torque transfer magnetization switching (STS), abbreviated Spin-RAM. The Spin-RAM is programmed by magnetization reversal through an interaction of a spin momentum-torque-transferred current and a magnetic moment of memory layers in magnetic tunnel junctions (MTJs), and therefore an external magnetic field is unnecessary as that for a conventional MRAM.

A spin-torque MTJ element has two ferromagnetic layers and a spacer layer between the ferromagnetic layers. One ferromagnetic layer is a pinned magnetic layer and the other ferromagnetic layer is a free magnetic layer. The spacer layer is a tunnel barrier layer. When a spin polarized electron flows through the ferromagnetic layers, the spin direction rotates according to the directions of magnetic moment. The rotation of spin direction of the electrons in the ferromagnetic layers is the origin of a spin-torque to the magnetic moment. If the given torque is large enough, magnetization of ferromagnetic layer and thus the magnetic moment is reversed. The magnetization of the ferromagnetic layers transforms from parallel to anti-parallel alignment. This changes the MTJ element from a low resistance state to a high resistance state thus changing the logic state of the MTJ element from a first logic state (0) to a second logic state (1). A voltage source provides the programming voltage that generates the programming current that is reversed appropriately change the programming state of the MTJ element. Reading an SMT MRAM cell involves applying a voltage across the SMT MRAM cell and detecting the resistance (or current) difference.

As illustrated in FIG. 1, a spin moment transfer (SMT) MRAM cell 100 consists of an MTJ element 105 and a Metal Oxide Semiconductor (MOS) gating transistor 110. The MTJ element 105 is composed of a pinned ferromagnetic layer 102 and a free ferromagnetic layer 104, and a tunnel barrier layer 103. The drain of the gating transistor 110 is connected through a nonmagnetic layer to the pinned ferromagnetic layer 102. The free ferromagnetic layer 104 is connected to a bit line 115 and the source of the gating transistor 110 is connected the source line 120. The bit line 115 and source select line 120 are connected to the bipolar write pulse/read bias generator 125. The bipolar write pulse/read bias generator 125 provides the necessary programming current to the MTJ element 105 through the bit line 115 and the source select line 120. The direction being determined by logic state being programmed to the MTJ element 105.

The gate of the gating transistor 110 is connected to a word line 130. The word line 130 transfers a word line select voltage to the gate of the gating transistor 110 to activate the gating transistor 110 for reading or writing the logic state of the MTJ element 105. A sense amplifier 135 has one input terminal connected to the bit line and a second input terminal connected to a voltage reference circuit. When the word line 115 has the word line select voltage activated to turn on the gating transistor 110, the bipolar write pulse/read bias generator 125 generates a bias current that passes through MTJ element 105. A voltage is developed across the MTJ element 105 that is sensed by the sense amplifier 135 and compared with the reference voltage generator to determine the logic state written to the MTJ element 105. This logic state is transferred to the output terminal of the sense amplifier 135 as to the data output signal 145.

Arrays of spin moment transfer (SMT) MRAM cell 100 are arranged in rows and columns. Each row of the SMT MRAM devices may have their source line 120 commonly connected to a source line selection circuit or tied to a ground reference point. In other arrangements of an array of SMT MRAM cells 100, as shown in U.S. Patent Application 2006/0018057 (Huai), the SMT MRAM cells 100 are organized into an array having two bit lines. The two bit lines are structures such that the current flowing perpendicularly through the MTJ 105 is controlled by the difference of the bias voltages of the two bit lines for each spin moment transfer (SMT) MRAM cell 100. Two reading/writing column selection circuits are provided to control the voltages on the bit lines.

SUMMARY OF THE INVENTION

An object of this invention is to provide an array of SMT MRAM cells with a read reference circuit to provide a reference current to the sense amplifiers for reading a data state from selected SMT MRAM cells of the array.

Another object of this invention is to provide a read reference circuit such that read reference circuit will not be disturbed during a read operation.

Another object of this invention is to compensate for current mismatching in the reference current caused by second order non matching effect.

To accomplish at least one of these objects, an array of SMT MRAM cells is arranged in rows and columns. Each of the columns of SMT MRAM cells is connected to a true bit line and a complement bit line. At least two of the columns of SMT MRAM cells are connected to be reference SMT MRAM cells. The reference SMT MRAM cells of the first of the two columns are programmed to have a maximum resistance of a first data state and the reference SMT MRAM cells of the second of the two columns are programmed to have a minimum resistance of a second data state. The complement bit line of the first column of SMT MRAM cells is connected to the true bit line of the second column of SMT MRAM cells. The connected complement bit line and the true bit line are connected to a voltage biasing circuit such that a minimum reference current is passed through the complement bit line and a maximum reference current is passed through the true bit line. The voltage biasing circuit is connected to a reference input of a sense amplifier such that the voltage developed as the reference input is a function of a sum of the maximum reference current and the minimum reference current such that the reference SMT MRAM cells will not be disturbed during a read operation.

A compensation device is joined to the connected true bit line and the complement bit to generate a compensation current to offset a current variation due to current mismatching in the reference current caused by second order non matching effect of a body effect of a gating transistor connected to the complement bit line connected to the true bit line. The compensation device is a MOS transistor having a gate biased with a compensation voltage to cause the MOS transistor to conduct with the compensation current.

In other embodiments, a read reference circuit for an array of SMT MRAM cells has at least two of the columns of SMT MRAM cells appended to the array of the SMT MRAM cells. The reference SMT MRAM cells of the first of the two columns are programmed to have a maximum resistance of a first data state and the reference SMT MRAM cells of the second of the two columns are programmed to have a minimum resistance of a second data state. The complement bit line of the first column of SMT MRAM cells is connected to the true bit line of the second column of SMT MRAM cells. The connected complement bit line and the true bit line are connected to a voltage biasing circuit such that a minimum reference current is passed through the complement bit line and a maximum reference current is passed through the true bit line. The voltage biasing circuit is connected to a reference input of a sense amplifier such that the voltage developed as the reference input is a function of a sum of the maximum reference current and the minimum reference current such that the reference SMT MRAM cells will not be disturbed during a read operation.

A compensation device is joined to the connected complement and the true bit lines to generate a compensation current to offset a current variation due to current mismatching in the reference current caused by second order non matching effect of a body effect of a gating transistor connected to the complement bit line. The compensation device is a MOS transistor having a gate biased with a compensation voltage to cause the MOS transistor to conduct with the compensation current.

In another embodiment, a method for generating a reference current for determining a data state of selected SMT MRAM memory cells begins by appending a column pair of reference SMT MRAM cells to an array of SMT MRAM memory cells such that each row of the SMT MRAM memory cells corresponds to one row of the column pair of reference SMT MRAM cells. The reference SMT MRAM cells of a first column are programmed to have a maximum resistance for the reference SMT MRAM cells. The reference SMT MRAM cells of a second column are programmed to have a minimum resistance for the reference SMT MRAM cells. The column pair of reference SMT MRAM cells are joined commonly at the sources of column select transistors and joined to a biasing circuit to generate a reference voltage that is applied to a reference terminal of sense amplifiers connected to each column of the SMT MRAM memory cells such that the reference SMT MRAM cells will not be disturbed during a read operation. The column pair of reference SMT MRAM cells are connected to a compensation circuit that generates a compensation current to offset a current variation due to current mismatching in the reference current caused by second order non matching effects of a body effect of a gating transistor connected to the complement bit line connected to the true bit line. The compensation circuit has a MOS transistor having a gate biased with a compensation voltage to cause the MOS transistor to conduct the compensation current.

During operation a request is determined if the request is for a read operation or for a write operation. If the request is for a write operation, the process is ended. Upon receipt of a read operation, the columns to be read are selected and activated. The reference columns are activated to generate the reference current to create the reference voltage at the reference terminal of the sense amplifiers. A data voltage created by the data current from the SMT MRAM memory cells is compared to the reference current and the data is determined and the read process is ended. During the read operation, the reference SMT MRAM cells are not disturbed.

DETAILED DESCRIPTION OF THE INVENTION

Figure 1:
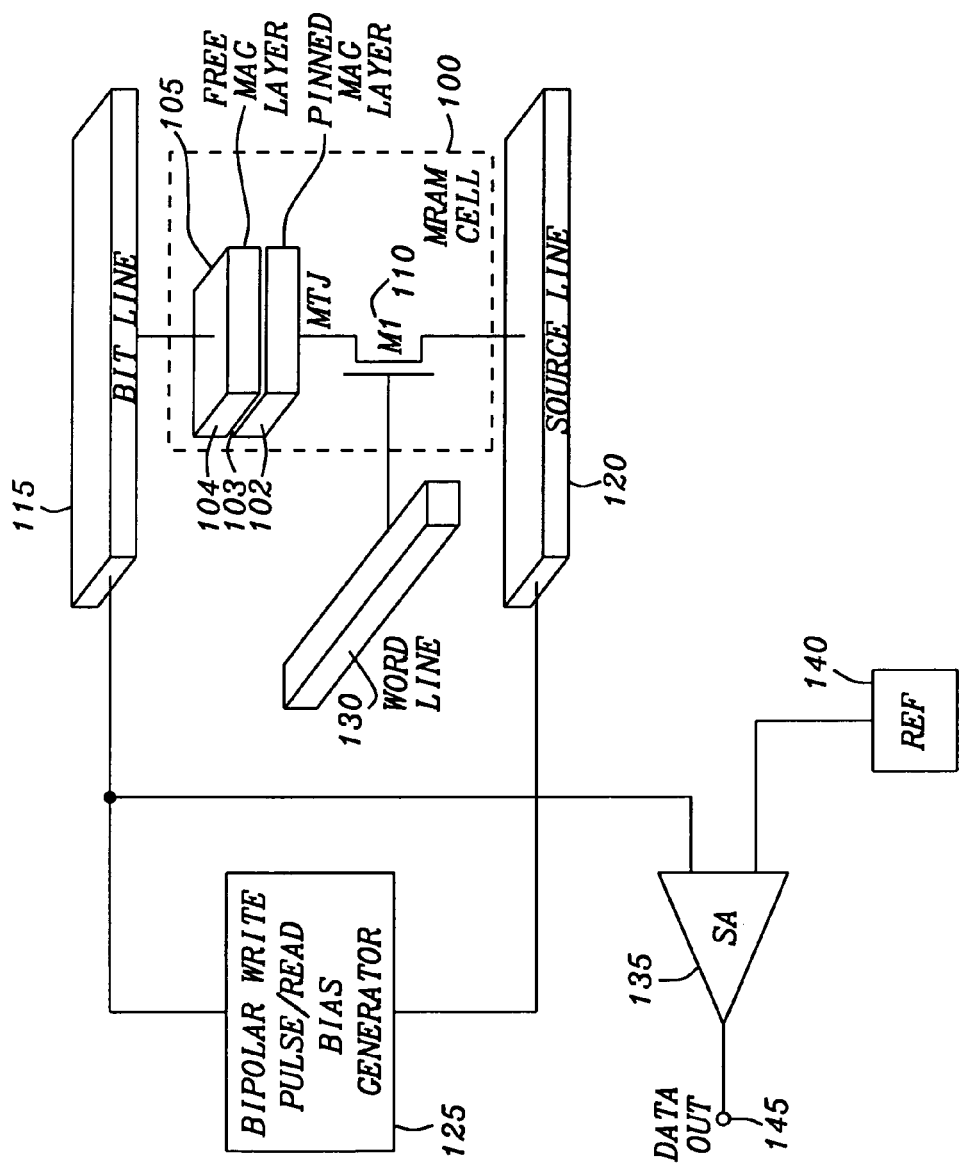
FIG. 1 is a functional diagram of a SMT MRAM memory cell and its peripheral circuitry of the prior art.
Figure 2:
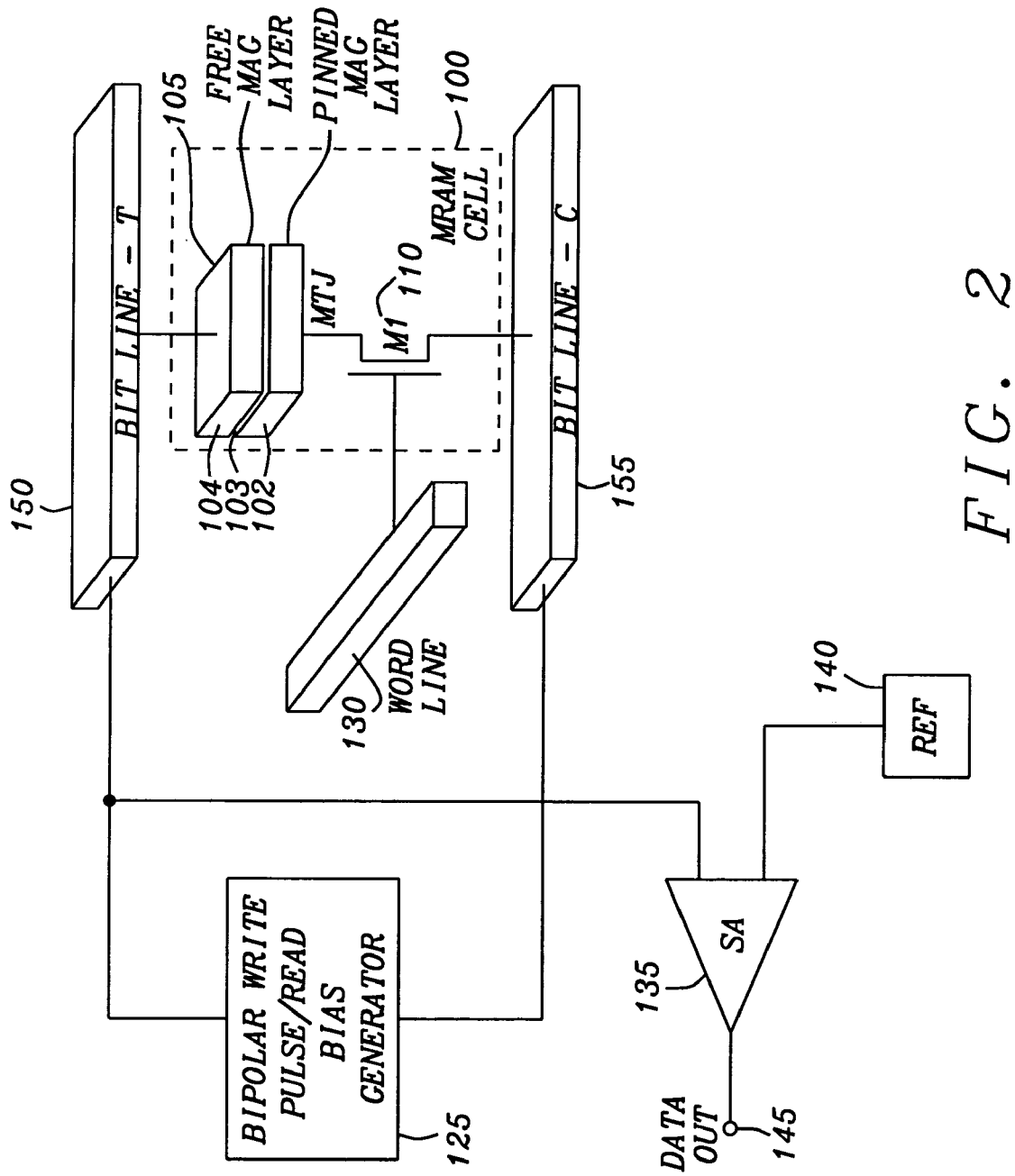
FIG. 2 is a functional diagram of a SMT MRAM memory cell and its peripheral circuitry.

The embodiments of SMT MRAM cell arrays have columns of SMT MRAM memory cells with pairs of bit lines, for the sake of convention, have one of the bit line referred to as a true bit line and the other bit line referred to as the complement bit line. In the prior art, as described in Huai, each column of cells has a pair of bit lines. Referring to FIG. 2, the structure of the SMT MRAM memory cell is essentially identical to that of FIG. 1, except the source of the gating transistor 110 of the SMT MRAM memory cell 100 is connected to a complement bit line 155. In the embodiments, the complement bit line 155 is structured to be in parallel with the true bit line 150. The true bit line 150 is connected to the free ferromagnetic layer 104 of the MTJ element 105. The true bit line 150 and the complement bit line 155 are connected to the bipolar write pulse/read bias generator 125.

Figure 3:
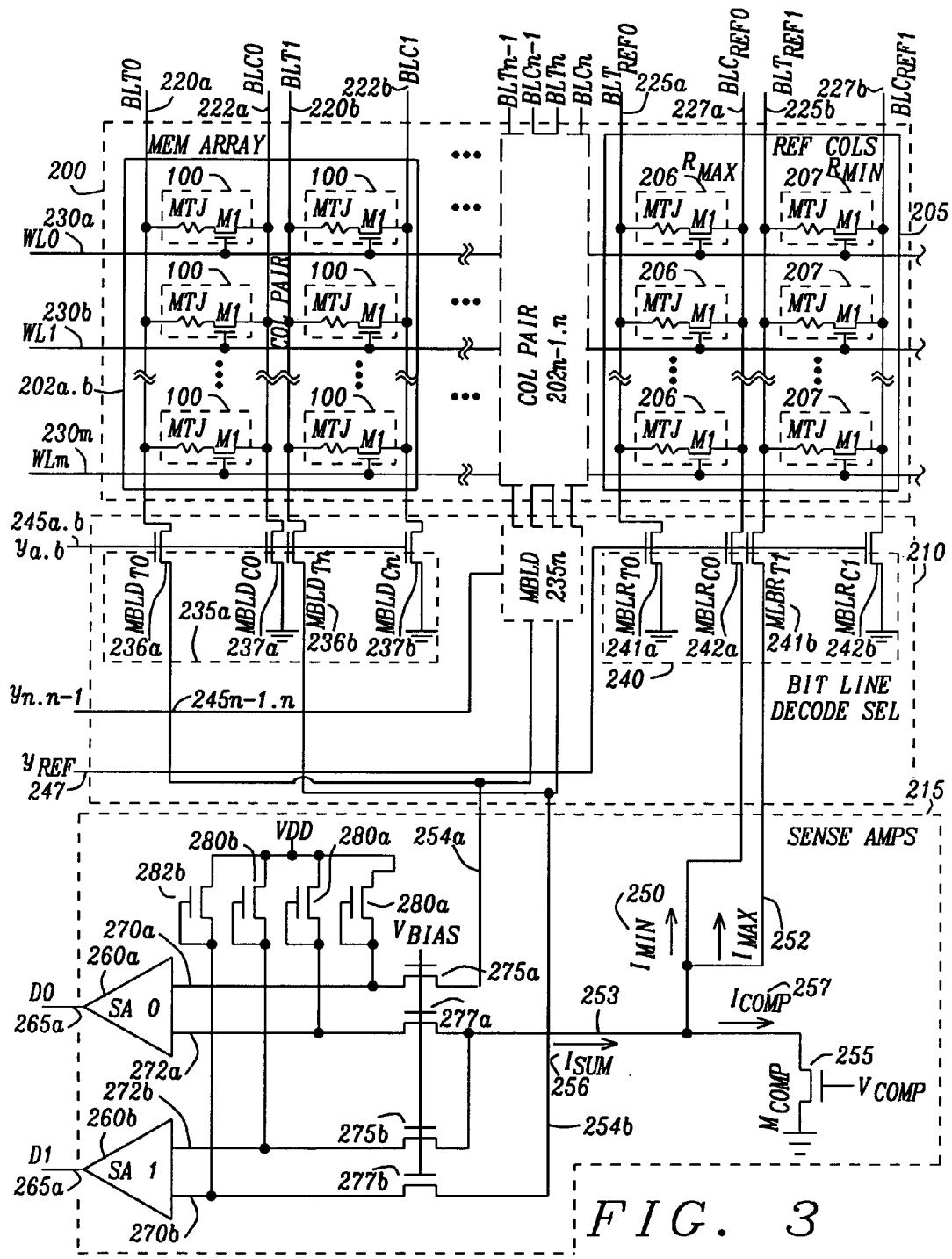
FIG. 3 is a schematic diagram of an embodiment of an array of SMT MRAM memory cells with a read reference current generating circuit.

FIG. 3 illustrates an embodiment of an array 200 of the SMT MRAM memory cells 100 with a read reference current generating circuit. The SMT MRAM memory cells 100 are arranged in rows and columns to form the array 200. The MTJ element of each of the SMT MRAM memory cells 100 is connected to one of the true bit lines $220a, \ldots, 220n$. The source of the gating transistor of each of the SMT MRAM memory cells 100 is connected to one of the complement bit lines $222a, \ldots, 222n$. Each of the word lines $230a, 230b, \ldots, 230m\text{-}1, 230m$ is connected to the gates of the gating transistors of the SMT MRAM cells 100 of one column of the array 200.

The read reference current generating circuit has a pair of columns 205 of reference SMT MRAM memory cells 206 and 207 is appended adjacent to the array 200 of the SMT MRAM memory cells. Each of the reference SMT memory cells 206 and 207 is identical in structure to the SMT memory cells 100. The reference SMT memory cells 206 of the first of the pair of columns 205 are programmed such that the MTJ element has a maximum resistance ($R_{MAX}$) and the reference SMT memory cells 207 of the second of the pair of columns 205 is programmed such that the MTJ element has a minimum resistance ($R_{MIN}$). The MTJ element of each of the reference SMT memory cells 206 and 207 is connected to one of the reference true bit lines 225a and 225b. The source of the gating transistor of each of the reference SMT memory cells 206 and 207 is connected to one of the complement bit lines 227a and 227b. Each of the word lines 230a, 230b, . . . , 230m-1, 230m is connected to the gates of the gating transistors of the reference SMT memory cells 206 and 207 of each of the pair of columns 205 of reference SMT MRAM memory cells 206 and 207.

Each of the true bit lines 220a, . . . , 220n and complement bit lines 222a, . . . , 222n of the SMT Memory array 200 is connected to a bit line decoder selector 210. The bit line decoder selector has pairs of the data bit line select transistors 235a, . . . , 235n such that the data bit line select transistors 236a, . . . , 236n have their drains connected to the true bit lines 220a, . . . , 220n of the array 200 and the data bit line select transistors 237a, . . . , 237n have their drains connected to the complement bit lines 222a, . . . , 222n. The gates of the data bit line select transistors 235a, . . . , 235n are respectively connected to a bit line decoder (not shown) to receive a bit line select signals $y_{a.b}$, $y_{n-1.n}$ 245a.b, 245n-1.n that select the columns for transferring data from a selected row to the sense amplifiers 215. The sources of the data bit line select transistors 236a, . . . , 236n are connected to the sense amplifiers 215 and the sources of the data bit line select transistors 237a, . . . , 237n are connected to the ground reference voltage source during a read operation.

Each of the true bit lines 225a and 225b and complement bit lines 227a and 227b of the pair of columns 205 of reference SMT MRAM memory cells 206 and 207 is connected to a bit line decoder selector 210. The bit line decoder selector has pairs of the reference bit line select transistors 240 where the reference bit line select transistors 241a and 241b that have their drains connected to the true reference bit lines 225a and 225b of the pair of columns 205 and the reference bit line select transistors 242a, . . . , 242b that have their drains connected to the complement reference bit lines 227a and 227b. The gates of the reference bit line select transistors 241a and 241b and 242a and 242b are connected to a bit line decoder (not shown) to receive a bit line select signal $y_{REF}$ 247 that selects to reference columns 205 for transferring the reference from a selected row to the sense amplifiers 215. The sources of the reference bit line select transistors 241b and 242a are connected together at the point 253 and then connected to the sense amplifiers 215. The sources of the reference bit line select transistors 241a and 242b are connected to the ground reference voltage source. When selected, the current conducted through the selected reference SMT memory cells 206 with the maximum resistance $R_{MAX}$ will be the minimum current $I_{MIN}$ 250. Similarly, the current conducted through the selected reference SMT memory cells 207 with the minimum resistance will be the maximum current $I_{MAX}$ 252. By connecting the sources of the reference bit line select transistors 241b and 242a the currents $I_{MIN}$ 250 and $I_{MAX}$ 252 are additively combined to form the summed reference current $I_{SUM}$ 256 such that the reference SMT MRAM cells will not be disturbed during the read operation. The summed reference current $I_{SUM}$ 256 generates a reference voltage at the reference input terminals 272a and 272b of each of the sense amplifiers 260a and 260b. The current passing through the SMT MRAM memory cells 100 of one of the selected rows of the array 200 develops a voltage at the input voltage terminal 270a and 270b of each of the sense amplifiers 260a and 260b. The voltage is compared to the reference voltage to determine the data state of the outputs 265a and 265b.

The bias transistors 275a and 275b and 277a and 277b have their gates connected to the bias voltage source $V_{BIAS}$. The bias voltage source $V_{BIAS}$ causes the bias transistors 275a and 275b and 277a and 277b to be in saturation such that the voltage levels at the nodes 253, 254a, and 254b are set to a bias voltage bias level of approximately 100 mV. The bias voltage bias level is approximately an NMOS transistor threshold voltage level less than the bias voltage source $V_{BIAS}$. The diode connected MOS transistors 282a and 282b are connected between the reference terminals 270a and 270b and the power supply voltage source VDD. The diode connected MOS transistors 280a and 280b are connected between the reference terminals 272a and 272b and the power supply voltage source VDD. The voltage levels at the sense input voltage terminal 270a and 270b and reference voltage terminals 272a and 272b of the sense amplifiers 260a and 260b depend on the voltage drop from the load diode connected MOS transistors 280a, 280b, 282a, and 282b. These voltage drops depend on the currents sinking into the sense input voltage terminal 270a and 270b and reference voltage terminals 272a and 272b.

The body effect of the gating transistor of the reference SMT MRAM memory cells 206 causes a second order non matching with the corresponding data bits being read. The second order non matching effect is compensated with a compensation current $I_{COMP}$ 257. The compensation current $I_{COMP}$ 257 is generated by the compensation transistor $M_{COMP}$ 255. The drain of the compensation transistor $M_{COMP}$ 255 is connected to the common connection point 253. The source of the compensation transistor $M_{COMP}$ 255 is connected to the ground reference voltage source and the gate is connected to the compensation biasing voltage source $V_{COMP}$. The compensation current $I_{COMP}$ 257 is either determined by simulation or through trimming its value through empirical data.

Figure 4:
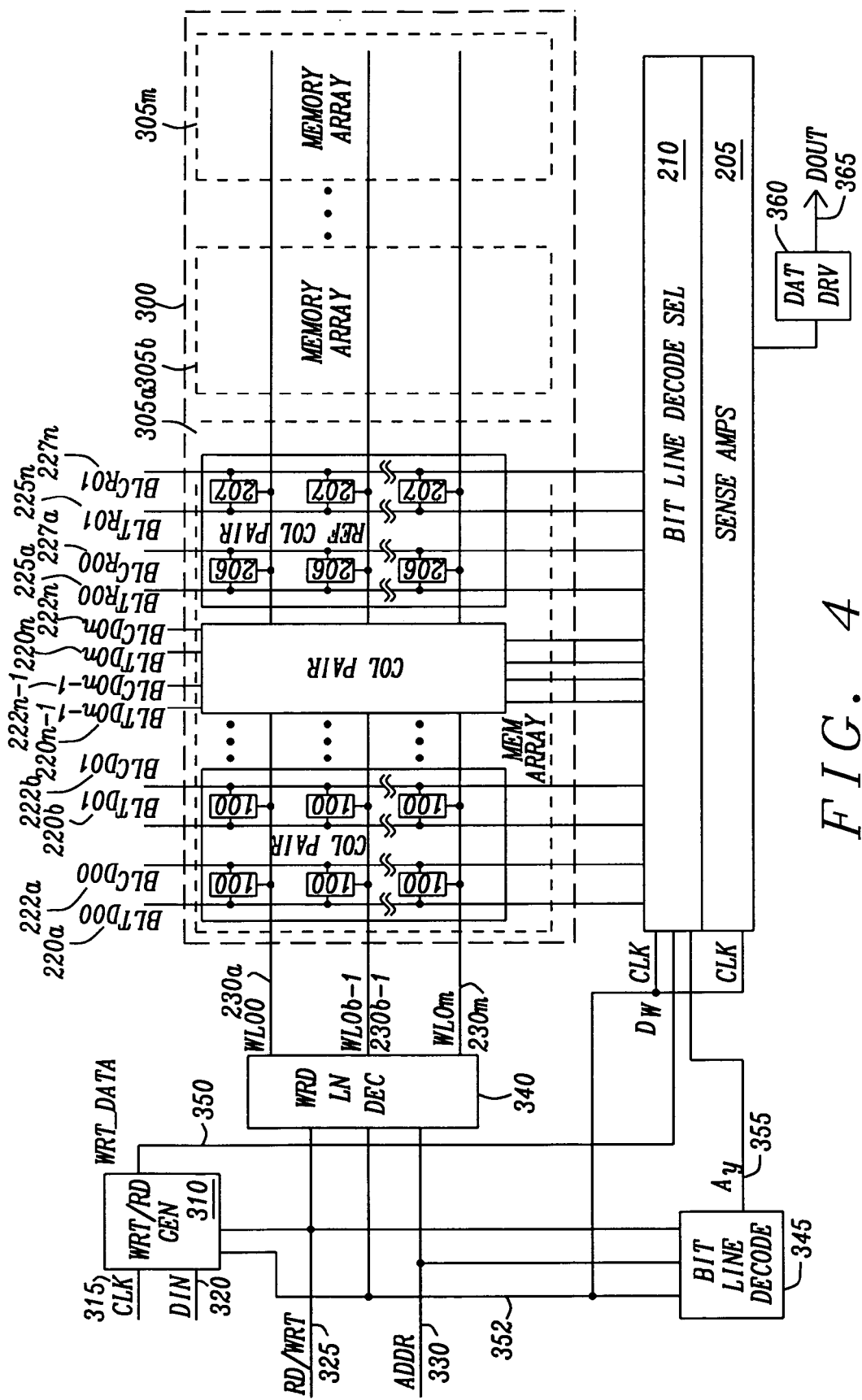
FIG. 4 is block diagram of an embodiment of an SMT MRAM memory device with a read reference circuit for discussion of a read operation.

FIG. 4 is block diagram of an embodiment of an SMT MRAM memory device showing a memory array 300 including multiple sub-arrays 305a, 305b, . . . , 305n. Each of the multiple sub-arrays 305a, 305b, . . . , 305n are structured and operate as the memory array illustrated in FIG. 3 and the corresponding labels of FIG. 4 are identical to those of FIG. 3.

The input signals to the SMT MRAM memory device are the control signals including the clock 315 and the read/write signals 325, the data input signals 320, and the address signals 330. The read/write generator receives the clock 315 and the read/write signals 325 and the data input signal 320 and generates the voltage levels and timing signals for transferring the write data 350 to the bit line decode select circuit 210. The bit line decode select circuit 210 includes write circuitry (not shown in FIG. 3) for programming the SMT MRAM memory cells with the data $D_W$ to be written.

The address 330 is transferred to the word line decoder 340 and the bit line decoder 345. The word line decoder 340 decodes the portion of the address 330 to select the desired rows of the memory array 300 for reading the SMT MRAM cells on the selected row. The word line decoder 340 activates the selected word line 230a, 230b, . . . , 230m-1, or 230m to turn on the gating transistors of the SMT MRAM memory cells 100 for reading and writing the selected SMT MRAM memory cells 100. The bit line decoder 345 generates one or more of the column activation signals Ay 355 that are applied to the pairs of the bit line select transistors 235a, . . . , 235n and the pairs of the reference bit line select transistors 240 for appropriately activating the selected columns for reading and writing. The read/write signal 325 is applied to the word line decoder 340 and the bit line decoder 345 to determine the action being performed is a read or write operation. If the operation is a read operation, the reference bit line select signal $y_{REF}$ 247 is activated for transferring the reference currents $I_{MIN}$ and $I_{MAX}$ to the selected row of the reference SMT MRAM cells 206 and 207 for generating the average reference current $I_{AVG}$ 256 as described in FIG. 3.

The internal clock 352 is generated from the external clocking 315 in the read/write generator 310. The read/write generator 310 generates the internal clock 310 based on the signal conditions and phasing required by the word line decoder 340, bit line decoder 345, the bit line decoder selector 210 and the sense amplifiers 205. The sense amplifiers 205 transfer the read data to the data driver 360 which conditions the data signals 365 for driving to external circuitry (not shown).

Figure 5:
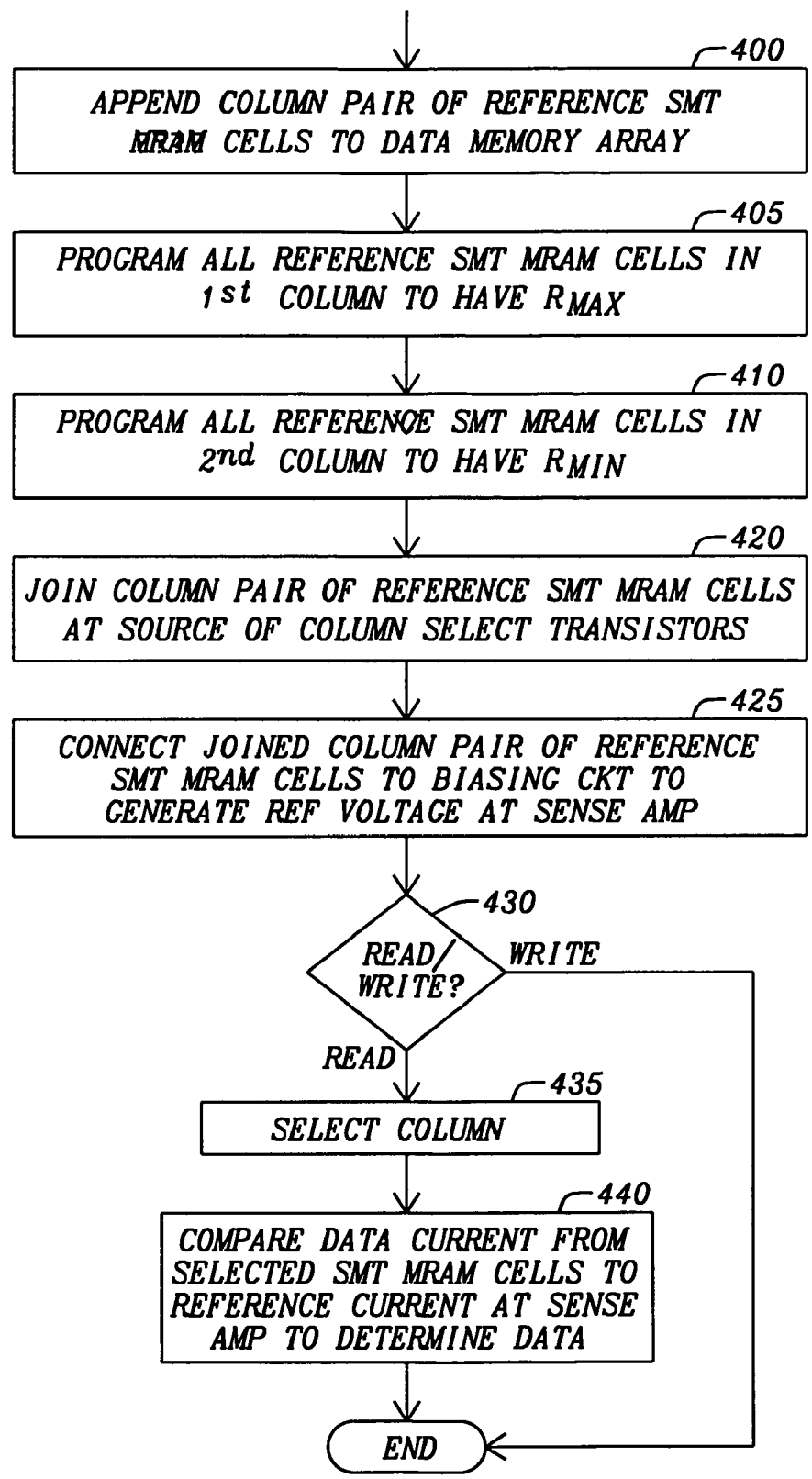
FIG. 5 is a flow chart for a method for generating a read reference current for determining a data state of selected SMT MRAM memory cells.

Refer now to FIG. 5 for a discussion of an embodiment of a method for generating a reference current for determining a data state of selected SMT MRAM memory cells in a read operation. The method for generating a reference current for determining a data state of selected SMT MRAM memory cells during a read begins by appending (Box 400) a column pair of reference SMT MRAM cells to an array of SMT MRAM memory cells such that each row of the SMT MRAM memory cells corresponds to one row of the column pair of reference SMT MRAM cells. The reference SMT MRAM cells of a first column are programmed (Box 405) to have a maximum resistance for the reference SMT MRAM cells. The reference SMT MRAM cells of a second column are programmed (Box 410) to have a minimum resistance for the reference SMT MRAM cells. The column pair of reference SMT MRAM cells are joined (Box 420) commonly at the sources of column select transistors. The column pair of reference SMT MRAM cells are joined (Box 425) to a biasing circuit to generate a reference voltage that is applied to a reference terminal of sense amplifiers connected to each column of the SMT MRAM memory cells such that the column pair of reference SMT MRAM cells will not be disturbed during the read operation. The column pair of reference SMT MRAM cells are connected to a compensation circuit that generates a compensation current to offset a current variation due to current mismatching in the reference current caused by second order non matching effects of a body effect of a gating transistor connected to the complement bit line. The compensation circuit has a MOS transistor having a gate biased with a compensation voltage to cause the MOS transistor to conduct the compensation current.

During operation a request is determined (Box 430) if the request is for a read operation or for a write operation. If the request is for a write operation, the process is ended. Upon receipt of a read operation, the columns to be read are selected (Box 435) and activated. The reference columns are activated to generate the reference current to create the reference voltage at the reference terminal of the sense amplifiers, while not disturbing the column pair of reference SMT MRAM cells. A data voltage created by the data current from the SMT MRAM memory cells is compared (Box 440) to the reference current and the data is determined and the read process is ended.

While this invention has been particularly shown and described with reference to the preferred embodiments thereof, it will be understood by those skilled in the art that various changes in form and details may be made without departing from the spirit and scope of the invention.

The invention claimed is:

1. An SMT MRAM memory device comprising:
an array of SMT MRAM cells arranged in rows and columns;
a plurality of sense amplifiers, wherein each sense amplifier is in communication with one of the columns of SMT MRAM cells to sense a read data current to determine a data state of selected SMT MRAM cells;
a read reference circuit to provide a read reference current to sense amplifiers for reading a data state from selected SMT MRAM cells of the array, wherein the read reference circuit comprises:
at least two columns of reference SMT MRAM cells appended to the array of SMT MRAM cells with a word line connected to each row of the array of the SMT MRAM cells connected to an associated row of the reference SMT MRAM cells, where the reference SMT MRAM cells of a first of the two columns are programmed to have a maximum resistance of a first data state and the reference SMT MRAM cells of a second of the two columns are programmed to have a minimum resistance of a second data state, wherein a true bit line of the first column of reference SMT MRAM cells is connected to the complement bit line of the second column of reference SMT MRAM cells such that the read reference circuits will not be disturbed during the reading of the data state from the selected SMT MRAM cells.

2. The SMT MRAM memory device of claim 1 further comprising:
a compensation device is joined to the read reference circuit to generate a compensation current to offset a current variation due to current mismatching in the reference current caused by second order non matching effect of a body effect of a gating transistor of the reference SMT MRAM cells.

3. The SMT MRAM memory device of claim 1 wherein the read reference circuit further comprises:
a voltage biasing circuit connected to the connected true bit line and complement bit line such that a minimum reference current is passed through the complement bit line and a maximum reference current is passed through the true bit line, wherein the voltage biasing circuit is connected to a reference input of a sense amplifier such that the voltage developed as the reference input is a function of a sum of the maximum reference current and the minimum reference current.

4. The SMT MRAM memory device of claim 3 further comprising a compensation device joined to the connected true bit line and the complement bit to generate a compensation current to offset the current variation due to current mismatching in the reference current caused by the second order non matching effect of the body effect.

5. The SMT MRAM memory device of claim 4 wherein the compensation device comprises a MOS transistor having a gate biased with a compensation voltage to cause the MOS transistor to conduct with the compensation current.

6. A read reference circuit for an array of SMT MRAM cells comprising:
at least two of the columns of reference SMT MRAM cells appended to an array of the SMT MRAM cells with a word line connected to each row of the array of the SMT MRAM cells connected to an associated row of the reference SMT MRAM cells, where the reference SMT MRAM cells of the first of the two columns are programmed to have a maximum resistance of a first data state and the reference SMT MRAM cells of the second of the two columns are programmed to have a minimum resistance of a second data state, wherein a true bit line connected to the first column of reference SMT MRAM cells is connected to a complement bit line of the second column of reference SMT MRAM cells such that the reference SMT MRAM cells will not be disturbed during a read operation; and a voltage biasing circuit connected to the connected true bit line and complement bit line such that a minimum reference current is passed through the complement bit line and a maximum reference current is passed through the true bit line, wherein the voltage biasing circuit is connected to a reference input of a sense amplifier such that the voltage developed as the reference input is a function of a sum of the maximum reference current and the minimum reference current.

7. The read reference circuit of claim 6 further comprising a compensation device joined to the connected true bit line and the complement bit to generate a compensation current to offset the current variation due to current mismatching in the reference current caused by the second order non matching effect of the body effect.

8. The read reference circuit of claim 7 wherein the compensation device comprises a MOS transistor having a gate biased with a compensation voltage to cause the MOS transistor to conduct with the compensation current.

9. A method for generating a reference current for determining a data state of selected SMT MRAM memory cells comprising the steps of:

appending a column pair of reference SMT MRAM cells to an array of SMT MRAM memory cells such that each row of the SMT MRAM memory cells corresponds to one row of the column pair of reference SMT MRAM cells by the step of connecting a word line connected to each row of the array of the SMT MRAM cells to the corresponding row of the reference SMT MRAM cells;

connecting a true bit line of the first column of reference SMT MRAM cells to a complement bit line of the second column of reference SMT MRAM cells such that the column pair reference SMT MRAM cells will not be disturbed during reading of the data state from the selected SMT MRAM cells;

programming the reference SMT MRAM cells of a first column to have a maximum resistance for the reference SMT MRAM cells;

programming the reference SMT MRAM cells of a second column to have a minimum resistance;

joining the column pair of reference SMT MRAM cells commonly at a source of a column select transistor of each of the column pair of reference SMT MRAM reference cells such that the reference SMT MRAM cells will not be disturbed during a read operation; and connecting the column pair of reference SMT MRAM cells to a biasing circuit to generate a reference voltage that is applied to a reference terminal of sense amplifiers connected to each column of the SMT MRAM memory cells.

10. The method of claim 9 further comprising determining, during the read operation, that a request is for a read operation or for a write operation and upon receipt of a read operation, the column pair of reference SMT MRAM cells is activated to generate the reference current to create the reference voltage at the reference terminal of the sense amplifiers while not disturbing the reference SMT MRAM cells during the read operation.

11. The method of claim 10 further comprising the step of generating a compensation current to offset the current variation due to current mismatching in the reference current caused by the second order non matching effect of the body effect.

12. The method of claim 11 wherein generating the compensation current is performed by a compensation circuit comprising a MOS transistor having a gate biased with a compensation voltage to cause the MOS transistor to conduct with the compensation current.

* * * * *